United States Patent [19]
Ludwig et al.

[11] Patent Number: 5,999,954
[45] Date of Patent: Dec. 7, 1999

[54] LOW-POWER DIGITAL FILTERING UTILIZING ADAPTIVE APPROXIMATE FILTERING

[75] Inventors: Jeffrey T. Ludwig, Somerville; S. Hamid Nawab, Boston; Anantha P. Chandrakasan, Belmont; James M. Ooi, Cambridge; Shawn M. Verbout, Bedford, all of Mass.

[73] Assignees: Massachusetts Institute of Technology, Cambridge; Trustees of Boston University, Boston, both of Mass.

[21] Appl. No.: 08/853,665

[22] Filed: May 9, 1997

Related U.S. Application Data
[60] Provisional application No. 60/039,264, Feb. 28, 1997.

[51] Int. Cl.[6] ............................. G06F 17/17; G06F 17/10
[52] U.S. Cl. ......................... 708/312; 708/318; 708/319
[58] Field of Search ........................ 364/724.1, 724.17, 364/724.16; 375/350, 206; 341/143, 118; 708/312, 318, 319

[56] References Cited

U.S. PATENT DOCUMENTS

| | | |
|---|---|---|
| 4,467,441 | 8/1984 | Gritton . |
| 4,771,396 | 9/1988 | Watanabe et al. .................. 364/724.16 |
| 4,809,209 | 2/1989 | White ................................. 364/724.16 |
| 4,823,382 | 4/1989 | Martinez . |
| 5,325,318 | 6/1994 | Harris et al. .......................... 364/724.1 |
| 5,343,522 | 8/1994 | Yatrou et al. . |
| 5,375,146 | 12/1994 | Chalmers ................. 375/103 |
| 5,530,396 | 6/1996 | Vlatkovic ................. 327/552 |
| 5,585,802 | 12/1996 | Cabler et al. ........................ 341/144 |
| 5,621,675 | 4/1997 | Linz et al. ............. 364/724.1 |
| 5,646,621 | 7/1997 | Cabler et al. ........................ 341/143 |
| 5,732,107 | 3/1998 | Phillips et al. ......................... 375/296 |
| 5,734,598 | 3/1998 | Abbott et al. ....................... 364/724.19 |

FOREIGN PATENT DOCUMENTS 0656695 6/1995 European Pat. Off. .

OTHER PUBLICATIONS

Kawamura et al., IEEE (ICASSP 86, Tokyo), "A tap selection algorithm for adaptive filters", vol. 86, pp. 2979–2982, 1986.

*Primary Examiner*—Ayaz R. Sheikh
*Assistant Examiner*—Tim T. Vo
*Attorney, Agent, or Firm*—Samuels, Gauthier & Stevens, LLP

[57] ABSTRACT

A method of digital filtering and a digital filter having a filter response with a predetermined filter order. The filter response produces a predetermined set of filtered output samples defining an output signal from a received input signal. The difference between the power associated with the input signal and the power associated with the output signal is calculated. The filter order of the filter response is varied based on the calculated difference of power in order to change the filter response.

22 Claims, 12 Drawing Sheets

| SENTENCE NUMBER | MINIMUM ORDER | MAXIMUM ORDER | POWER CONSUMPTION ($P_{fixed} / P_{adaptive}$) |
|---|---|---|---|
| 1 | 3 | 99 | 4.4 |
| 2 | 3 | 117 | 6.3 |
| 3 | 3 | 87 | 5.6 |
| 4 | 3 | 93 | 5.9 |
| 5 | 3 | 61 | 4.2 |
| 6 | 3 | 119 | 5.9 |
| 7 | 3 | 125 | 7.1 |
| 8 | 3 | 111 | 7.1 |
| 9 | 3 | 127 | 7.1 |
| 10 | 3 | 107 | 8.3 |
| AVERAGE | 3 | 104.6 | 5.9 |

LOW-POWER DIGITAL FILTERING UTILIZING ADAPTIVE APPROXIMATE FILTERING

This application claims priority from provisional application Ser. No. 60/039,264 filed Feb. 28, 1997.

This invention was made with government support under Contract No. N00014-93-1-0686 by the U.S. Navy. The government has certain rights in the invention.

BACKGROUND OF THE INVENTION

The invention relates to low-power digital filtering with the use of adaptive approximate filtering.

The increasing demand for battery-operated portable electronic devices has made the minimization of power consumption a critical design criteria in digital signal processing algorithm development. Applications for low-power signal processing include cellular telephones, pagers, laptop computers, portable Global Positioning System (GPS) receivers, portable camcorders, and other wireless communications devices. The power consumption of a digital system is proportional to the average number of computations that are required per output sample to accomplish the desired processing. Thus reducing the number of computations required to perform a particular task directly results in reduced power consumption.

Power reduction in signal processing systems generally involves optimization at all levels of the design abstraction including consideration of process technology, logic and circuit design, architecture design, and algorithm selection. Typically, optimization to lower the power consumption is done statically at design time. However, significant power gains can be achieved if the optimization is done dynamically at run time by considering and adapting to time-varying signal statistics.

A significant number of DSP functions involve frequency-selective digital filtering in which the goal is to reject one or more frequency bands while keeping the remaining portions of the input spectrum largely unaltered. Examples include lowpass filtering for signal upsampling and downsampling, bandpass filtering for subband coding, and lowpass filtering for frequency-division multiplexing and demultiplexing. The exploration of low-power solutions in these areas is therefore of significant interest.

To first order, the average power consumption, P, of a digital system may be expressed as:

$$P = \sum_i N_i C_i V_{dd}^2 f_s \quad (1)$$

where $C_i$ is the average capacitance switched per operation of type i (corresponding to addition, multiplication, storage, or bus accesses), $N_i$ is the number of operations of type i performed per sample, $V_{dd}$ is the operating supply voltage, and $f_s$ is the sample frequency.

Real-time digital filtering is an example of a class of applications in which there is no advantage in exceeding a bounded computation rate. For such applications, an architecture-driven voltage scaling process has previously been developed in which parallel and pipelined architectures can be used to compensate for increased delays at reduced voltages. This strategy can result in supply voltages in the 1 to 1.5 V range by using conventional CMOS technology. Power supply voltages can be further scaled using reduced threshold devices. Circuits operating at power supply voltages as low as 70 mV (at 300K) and 27 mV (at 77K) have been demonstrated.

Once the power supply voltage is scaled to the lowest possible level, the goal is to minimize the switched capacitance at all levels of the design abstraction. At the logic level, for example, modules can be shut down at a very low level based on signal values. Arithmetic structures (e.g. ripple carry vs. carry select) can also be optimized to reduce transition activity. Architectural techniques include optimizing the sequencing of operations to minimize transition activity, avoiding time-multiplexed architectures which destroy signal correlations, using balanced paths to minimize glitching transitions, etc. At the algorithmic level, the computational complexity or the data representation can be optimized for low power.

Another method to reduce the switched capacitance is to lower the parameter $N_i$ in equation (1). Efforts have been made to minimize $N_i$ by intelligent choice of algorithm, given a particular signal processing task. In the case of conventional filter design, the filter order is fixed based on worst case signal statistics, which is inefficient if the worst case seldom occurs. More flexibility may be incorporated by using adaptive filtering algorithms, which are characterized by their ability to dynamically adjust the processing to the data by employing feedback mechanisms.

In accordance with the invention, it will be illustrated how adaptive filtering concepts may be exploited to develop low-power implementations for digital filtering.

SUMMARY OF THE INVENTION

Adaptive filtering algorithms have generally been used to dynamically change the values of the filter coefficients, while maintaining a fixed filter order. In contrast, the invention involves the dynamic adjustment of the filter order. This process leads to filtering solutions in which the filter output signal-to-noise ratio may be kept above a specified minimum tolerable level, or solutions in which the stopband energy in the filter output may be kept below a specified threshold, while using as small a filter order as possible. Since power consumption is proportional to filter order, the process of the invention achieves power reduction with respect to a fixed-order filter whose output is similarly guaranteed to have a signal-to-noise ratio above the specified level and a stopband energy below the specified threshold. Power reduction is achieved by dynamically minimizing the order of the digital filter.

The idea of dynamically reducing cost (e.g. power consumption) while maintaining a desired level of output quality (e.g. signal-to-noise ratio or stopband energy in the filter output) emanates from the concept of approximate processing in computer science. While approximate processing concepts may be used to describe a variety of existing techniques in DSP, communications, and other areas, there has recently been progress in formally using these concepts to develop new DSP techniques. Since our adaptive filtering technique falls into this category, the process used in the invention is referred to as adaptive approximate filtering, or simply approximate filtering.

The invention involves exploiting input signal statistics to significantly reduce the power consumption in frequency-selective digital filters. Rather than using a fixed filter order (as is the case in conventional filtering), the filter order is forced to vary over time with the aim of keeping the order as small as possible while ensuring that the ratio of the passband power to the stopband power of the filter output is kept above a specified threshold, or that the stopband power of the filter output is kept below a specified level. Power consumption is reduced since the number of operations required per output sample is dynamically minimized rather than being constrained to use a fixed filter order optimized for the worst case signal statistics. The invention has been shown to be effective in reducing power consumption by an order of magnitude or more in filtering applications involving speech signals.

Accordingly, the invention provides a method of digital filtering comprising providing a filter response with a predetermined filter order; receiving an input signal; producing a predetermined set of filtered output samples defining an output signal from said input signal; calculating the difference between the power associated with said input signal and the power associated with said output signal; and varying the filter order of said filter response based on the calculated difference of power in order to change said filter response. The motivation for changing the filter response is to reduce power consumption whenever possible.

In another embodiment of the invention there is provided a digital filtering system comprising a filter with a means for providing a filter response with a predetermined filter order, the filter response producing a predetermined set of filtered output samples defining an output signal from a received input signal. A means is provided for calculating the difference between the power associated with the input signal and the power associated with the output signal. A means is also provided for varying the filter order of the filter response based on the calculated difference of power in order to change the filter response.

DETAILED DESCRIPTION OF THE ILLUSTRATED EMBODIMENTS

A frequency-selective digital filter may have either a finite impulse response (FIR) or an infinite impulse response (IIR). It is well known that IIR filters use fewer taps than FIR filters in order to provide the same amount of attenuation in the stopband region. However, IIR filters introduce nonlinear frequency dispersion in the output signals which is unacceptable in some applications. For such cases it is desirable to use symmetric FIR filters because of their linear phase characteristic.

An important family of symmetric FIR filters correspond to the symmetric windowing of the impulse responses of corresponding ideal filters. For example, a lowpass filter of this type has an impulse response given by:

$$h[n] = w[n]\sin\omega_c \frac{n}{\pi n} \qquad (2)$$

where w[n] is a symmetric N-point window. Such a filter has cutoff frequency $\omega_c$ and can be implemented using a tapped delay line with N taps. For the purposes of describing the invention, such a filter is referred to as having filter order N.

Figure 1:
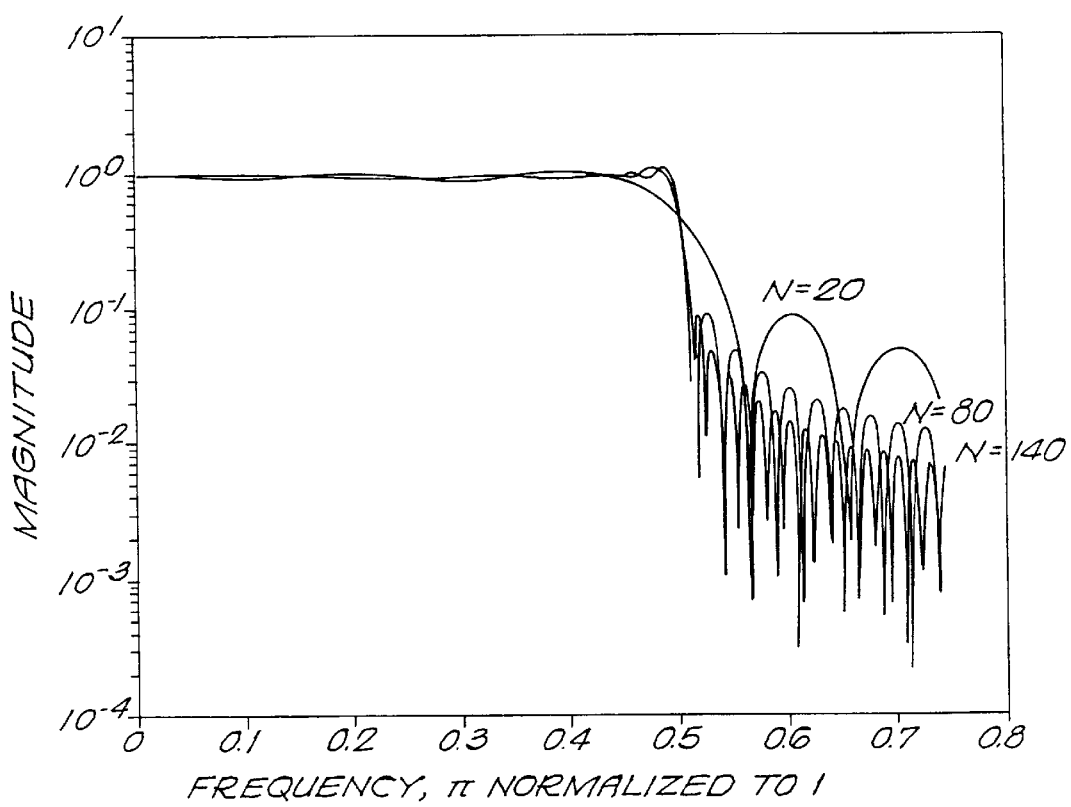
FIG. 1 is a graph displaying the frequency response magnitudes for FIR filters of orders N=20, 80 and 140.

FIG. 1 is a graph displaying the frequency response magnitudes of FIR filters of orders N=20, 80 and 140, when w[n] is a rectangular window and $\omega_c=\pi/2$. It will be appreciated that the mean attenuation beyond the cutoff frequency $\omega_c$ increases with filter order.

Figure 2:
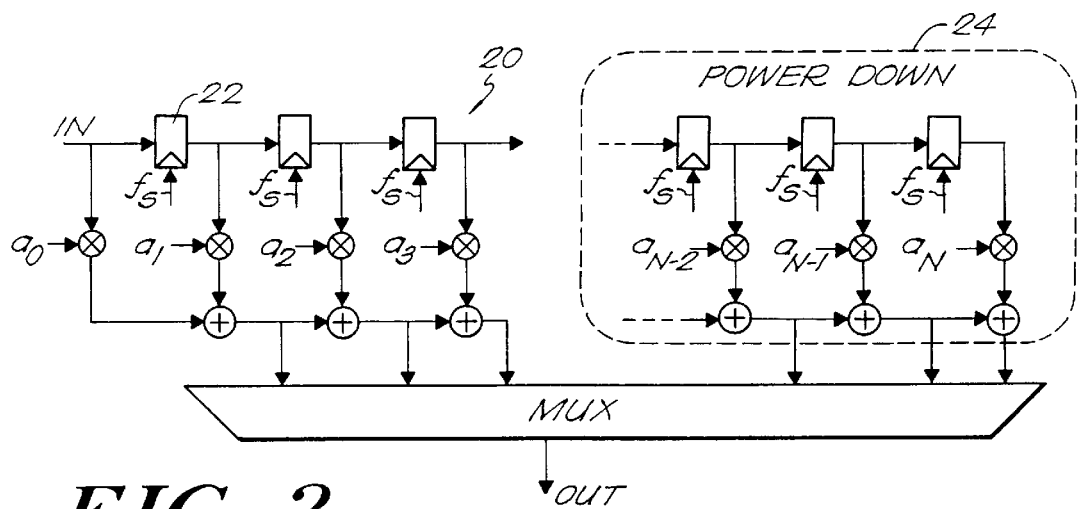
FIG. 2 is a schematic diagram of an adaptive approximate FIR filter implemented with a tapped delay line.

Furthermore, with respect to a tapped delay-line implementation 20 as shown in FIG. 2, the taps 22 of the shorter filters are subsets of the taps of the longer filters. This technique ensures that if the filter order is to be decreased without changing the cutoff frequency, a segment 24 of the tapped delay line for the higher order filter can simply be powered down. The price paid for such powering down is that the average stopband attenuation of the filter decreases.

Figure 3:
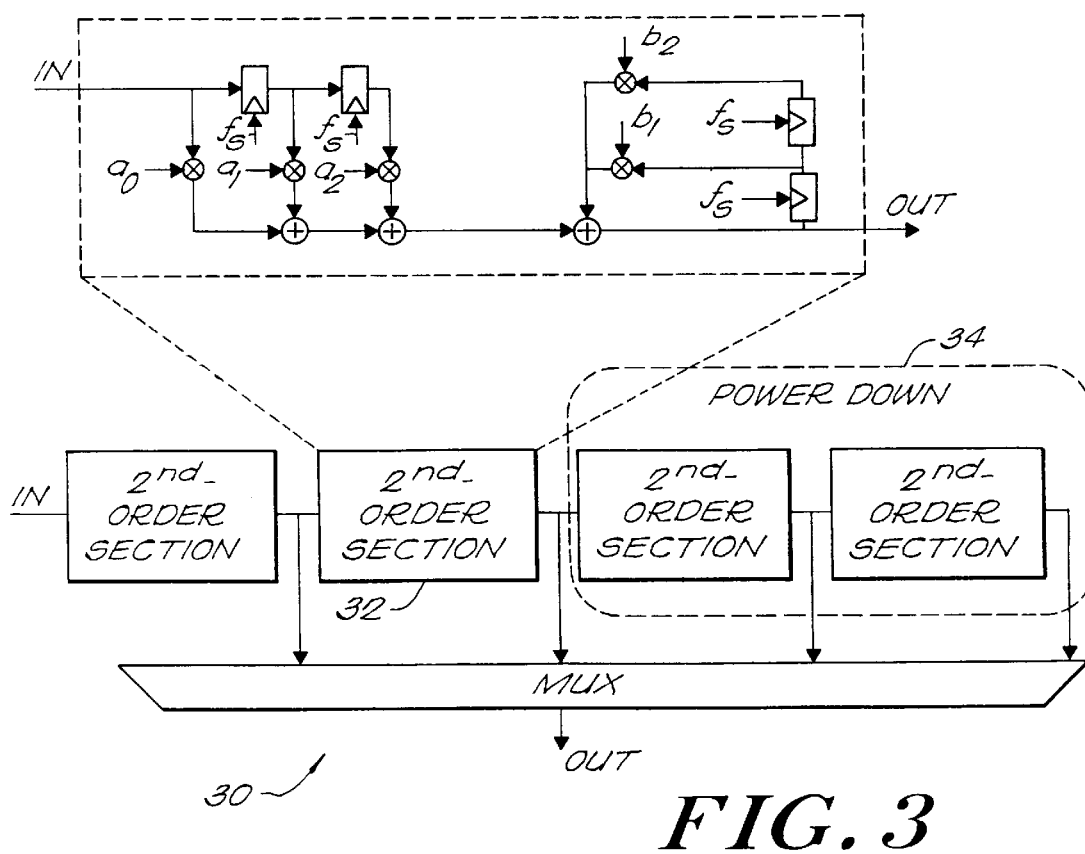
FIG. 3 is a schematic diagram of a cascade structure for an eighth-order adaptive approximate IIR filter.

Butterworth IIR filters are commonly used for performing frequency-selective filtering in applications where nonlinear frequency dispersion is tolerable. The frequency response magnitudes of such filters do not suffer from the ripples which can be seen in the frequency response magnitudes for FIR filters. These IIR filters are commonly implemented as cascade interconnections of second-order sections 32, each of which consists of 5 multiplies and 4 delays, as shown in FIG. 3. FIG. 3 is an illustration of a cascade structure for an eighth-order IIR filter 30 as the cascade of four second-order sections 32. For the purposes of describing the invention, the order of a Butterworth IIR filter is considered to be equal to twice the number of second-order sections in its cascade implementation. An interesting property of IIR Butterworth filters is that if the second-order sections are appropriately ordered, one may sequentially power down the later second-order sections 34 without changing the cutoff frequency of the filter. As in the case of the FIR filter, the price paid for powering down of second-order sections is that the average stopband attenuation of the filter decreases.

The details of the approximate processing process applied to low-power frequency-selective filtering in accordance with the invention will now be described. As described earlier, frequency-selective filters are used in applications where the goal is to extract certain frequency components from an input signal while rejecting others. Take for example a signal, x[n], consisting of a passband component, $x_p[n]$, and a stopband component, $x_s[n]$. That is, $$x[n]=x_p[n]+x_s[n]. \quad (3)$$

If it were possible to cost-effectively measure the strength of the stopband component, $x_s[n]$, from observation of x[n], it could be determined how much stopband attenuation is needed at any particular time. When the energy in $x_s[n]$ increases, it is desirable to increase the stopband attenuation of the filter. This can be accomplished by using a higher-order filter. Conversely, the filter order may be lowered when the energy in $x_s[n]$ decreases.

The invention presents a practical technique, based upon adaptive filtering principles, for dynamically estimating the energy fluctuation in the stopband component, $x_s[n]$, and using it to adjust the order of a frequency-selective FIR or IIR filter. As described in the previous section, the decrease in filter order enables the powering down of various segments of the filter structure. Powering down of the higher-order taps has the effect of reducing the switched capacitance at the cost of decreasing the attenuation in the stopband. Assuming that the FIR delay line is implemented using SRAM, even the data shifting operation of the higher-order taps can be eliminated through appropriate addressing schemes.

Figures 4, 6:
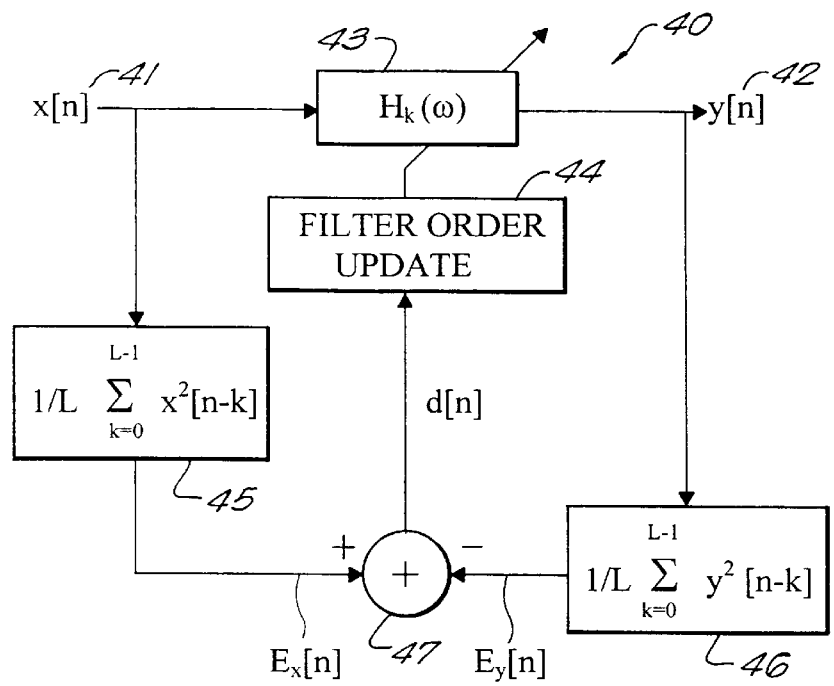
FIG. 4 is a functional block diagram of a filter and filtering technique in accordance with the invention.
FIG. 6 is a table which lists various measures obtained for the performance of an approximate filter as applied to a FDM signal.

FIG. 4 is a functional block diagram of a filter 40 and filtering technique in accordance with the invention. The filter includes an input 41 which receives an input signal x[n] and an output 42 which delivers an output signal 42. A filter response module 43 having a variable filter order transforms the input signal x[n] into the output signal y[n]. A filter order update controller 44 initiates the change in filter order of the filter response module 43. The filter order update varies the filter order in response to the calculated difference between the energy (power) associated with the input and output signals. Signal energy computational devices 45 and 46 respectively calculate the energies associated with the input and output signals. An adder 47 determines the energy difference between the input and output signals.

The quantity d[n], which represents the energy (power) differential between the input signal x[n] at input 41 and the output signal y[n] at output 42, is obtained as:

$$d[n]=E_x[n]-E_y[n] \quad (4)$$

where $$E_x[n] = \frac{1}{L}\sum_{k=0}^{L-1} |x[n-k]|^2 \quad (5)$$

and $$E_y[n] = \frac{1}{L}\sum_{k=0}^{L-1} |y[n-k]|^2. \quad (6)$$

The filter order for sample period n, Order[n], is updated at each sample period. One method for the update process is to choose order[n] to be the smallest positive integer which guarantees that the stopband energy, Q[n], of the output signal will be maintained below a specified threshold γ. Assuming that the stopband portion of the input spectrum is essentially flat (this flatness constraint may be relaxed considerably without detrimental effects), the stopband energy in the output can be estimated as:

$$Q[n]=\alpha d[n]E_{SB}[\text{Order}[n]] \quad (7)$$

where α is a proportionality constant, and $E_{SB}[k]$ represents the stopband energy in the frequency response, $H_k(\omega)$, of the kth order filter. That is, $$E_{SB}[k] = \frac{1}{2\pi}\int_{SB} |H_k(\omega)|^2 d\omega \quad (8)$$

where SB denotes the stopband region. Since for every sample period this method requires an expensive search over the stored values of $E_{SB}[k]$, a more efficient strategy which incrementally updates the most recent filter order has been designed. In this case, the stopband energy in the output is estimated as:

$$Q[n]=qd[n]E_{SB}[\text{Order}[n-1]]. \quad (9)$$

The decision rule for choosing Order[n] is then given by:

$$\text{Order}[n] = \begin{cases} \text{Order}[n-1] + N_0, & Q[n] > \gamma \\ \text{Order}[n-1], & \gamma - \delta \leq Q[n] \leq \gamma \\ \text{Order}[n-1] - N_0, & Q[n] < \gamma - \delta \end{cases} \quad (10)$$

where α, γ, δ, and $N_0$ are application-specific parameters. It should be noted that in this case the filter order is changed at most by $N_0$ during each sample period.

The parameters δ and $N_0$ in equation (10) control the sensitivity of the time evolution of the filter order. The choice of the parameter L in equations (5) and (6) involves a tradeoff between suppression of sensitivity to local fluctuations and preservation of the possible time-varying nature of the signal energy. For the case of FIR filters, it is also observed that when the value of L is less than the maximum filter order, there is no extra storage required to compute $E_x[n]$ beyond that required for the filter implementation. On the other hand, excess storage is always required to update $E_y[n]$.

The arithmetic cost of the update process can be easily shown to involve five multiplications, five additions, one table lookup from a small memory module, and simple control. This cost is roughly equivalent to that of increasing the FIR filter order by five or the IIR filter order by two. This, for example, means that net power savings can be expected in the FIR case if for significant periods of time the dynamic FIR filter order decreases by more than five with respect to the maximum filter order. The overhead of multiplication is reduced to one multiplication instead of five per update if absolute value operations are used to compute $E_x[n]$ instead of magnitude-squared operations.

In the context of FIR filters, simulations of the approximate filtering technique in accordance with the invention have been used to show that reduction in power consumption by an order of magnitude is achieved over fixed-order filter implementations when the stopband energy of the output signal is stipulated to remain below a given threshold γ. The context for most of these simulations is frequency-division demultiplexing of pairs of speech waveforms.

With respect to the application of speech signals, each of the speech signals used in simulations was sampled at 8 KHz and normalized to have maximum amplitude of unity. Each signal corresponds to a complete sentence with negligible silence at its beginning and end.

Each digitized speech waveform was pre-filtered to have a maximum frequency of 1.5 KHz. A guard band of 1 KHz was used in multiplexing a reference speech signal (corresponding to the sentence, "that shirt seems much too long,") with each of the other speech signals. The reference signal always occupied the 0 to 1.5 KHz band, while the other signals always occupied the 2.5 KHz to 4 KHz band.

Demultiplexing involves lowpass filtering (cutoff frequency 2 KHz) to isolate the reference speech signal. The approximate filtering technique was used to perform this lowpass filtering for each of the 10 FDM signals. The parameter values in equation (10) were chosen to be:

$$10\log\gamma = -40\text{dB}, \quad \delta = \frac{\gamma}{10}, \quad N_0 = 2, \quad L = 100. \tag{11}$$

Figure 5:
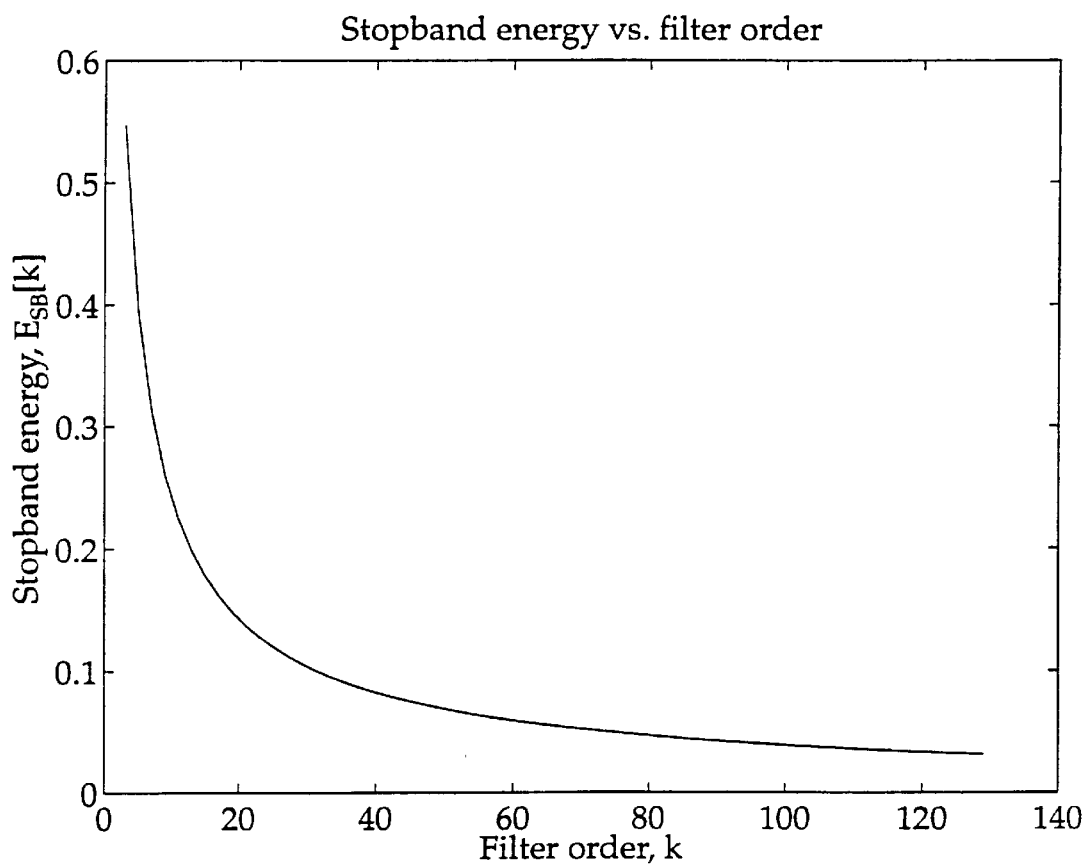
FIG. 5 is a graph showing a lot of the values of a FIR filter stopband energy $E_{SB}[k]$ vs. filter order k.

The family of FIR filters used in these simulations corresponds to equation (2) with w[n] rectangular. The values of the stopband energy $E_{SB}[k]$ vs. filter order for this case are plotted in the graph of FIG. 5.

In the table of FIG. 6 there are listed various measures obtained for the performance of the approximate filter as it was applied to each FDM signal. The first column contains the sentence number for the stopband component of the input signal. The second and third columns respectively list the minimum and maximum filter orders used by the approximate filter in each case. The final column shows the relative power consumption of the approximate filter with respect to a fixed-order filter which is guaranteed to keep the stopband energy in the output below γ for all times. It is observed that the adaptive technique of the invention reduces the power consumption on average by a factor of 5.9.

Figure 7:
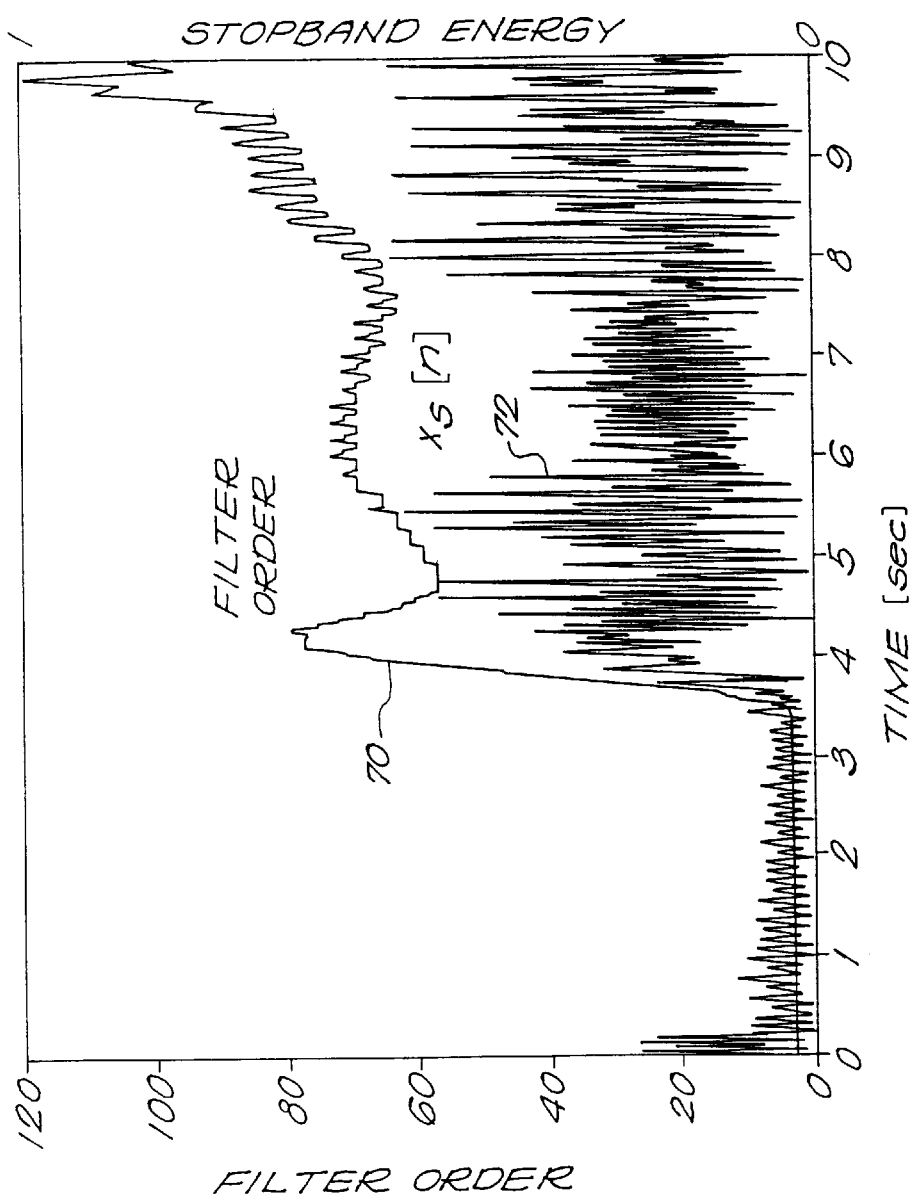
FIG. 7 is a graph showing plots of the evolution of filter order corresponding to an FDM input signal.

To gain further insight into the source for this power reduction, in FIG. 7 the nature of the adaptation performed by the technique of the invention in the case of one of the FDM signals is illustrated. One of the curves 70 shows the evolution of the filter order as a function of time while the other curve 72 shows the normalized energy profile of the stopband energy of the input signal as a function of time. Clearly, the variations in filter order roughly follow the energy variations of the stopband signal. In particular, the most power savings is achieved during the silence regions of the stopband component signal.

Figure 8:
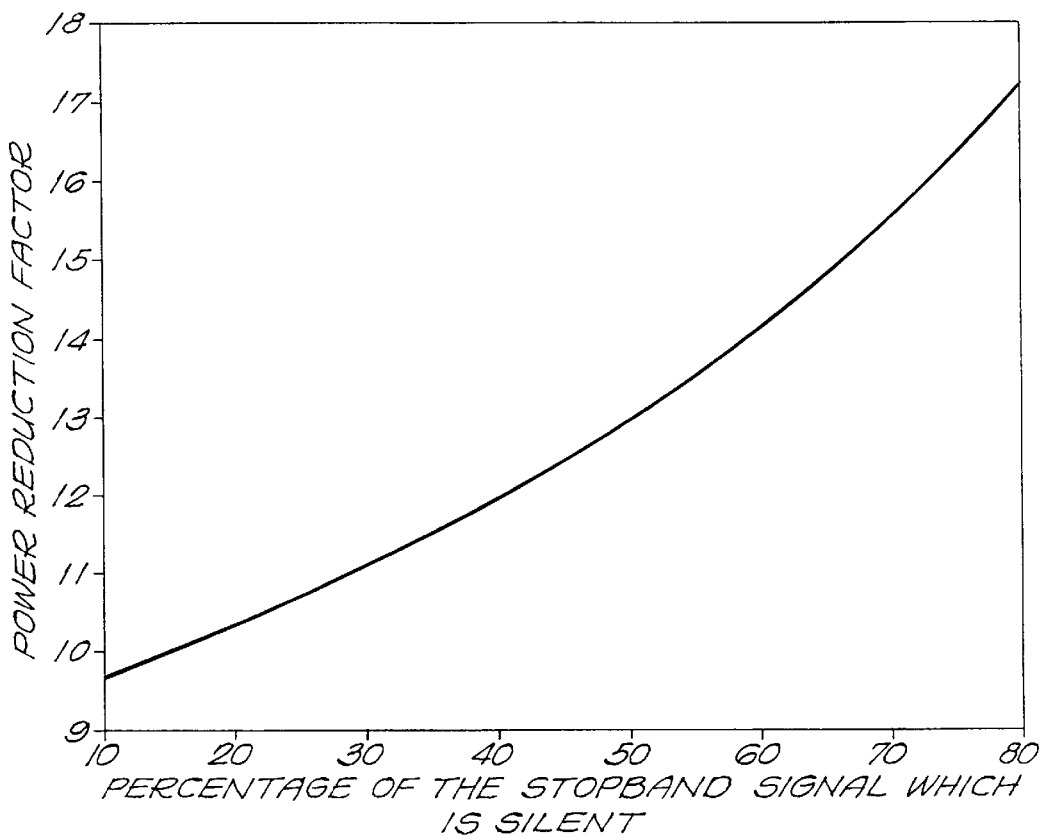
FIG. 8 is a graph showing a plot of the average of relative power consumption as a function of the silence duration relative to the duration of the entire signal.

Longer periods of speech communication generally include significantly larger fractions of silence periods than an individual sentence. To factor this into the analysis, the simulations were repeated while inserting additional silence at the end of each speech signal. The average (over all 10 cases) of the relative power consumption is displayed in the graph of FIG. 8 as a function of the silence duration relative to the duration of the entire signal. As expected, the power reduction improves as the relative amount of silence is increased.

Figure 9A:
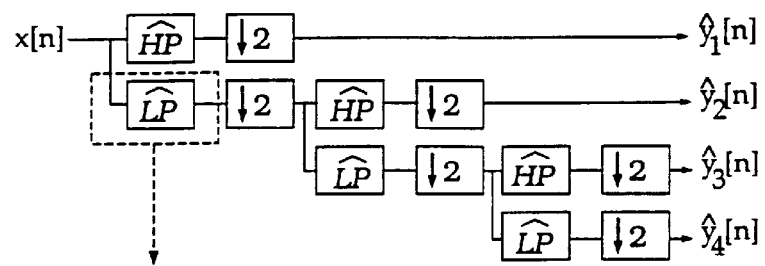
FIG. 9A is a schematic diagram of a binary tree-structured filterbank of highpass and lowpass filters implemented using the approximate filtering technique of the invention.
Figure 9B:
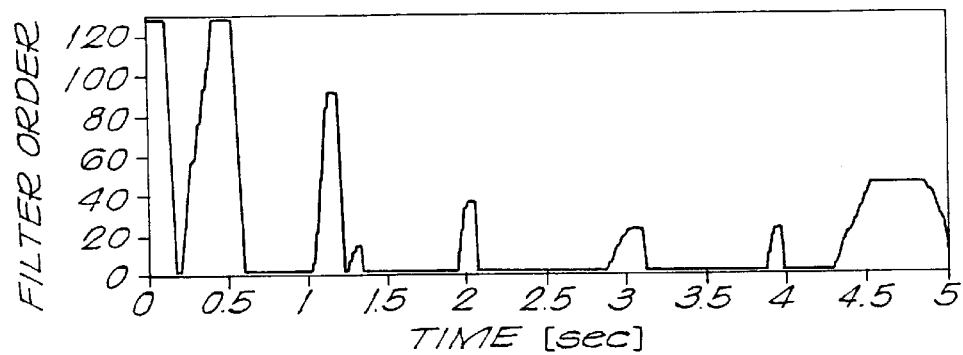
FIG. 9B is a graph showing a plot of the filter order as a function of time.
Figure 9C:
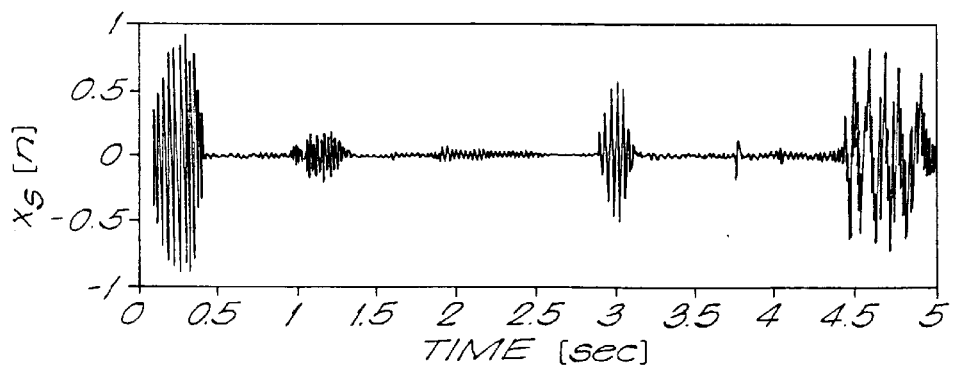
FIG. 9C is a graph showing a plot of the stopband component of the input, $x_s[n]$, to demonstrate that the filter order roughly tracks the stopband energy of the FDM input signal.

Data compression techniques for voice signals often use a binary tree-structured filterbank of highpass and lowpass filters, as depicted in FIG. 9A. Each of these filters may be implemented using the approximate filtering technique of the invention. To illustrate the potential for power savings in the first stage of the subband decomposition, an approximate FIR lowpass filter was applied to a speech signal, x[n], corresponding to the sentence, "that shirt seems much too long." The time-varying FIR filter order used by the technique of the invention is shown in the plot of FIG. 9B. The plot in FIG. 9C shows the stopband component of the input, $x_s[n]$, to demonstrate that the filter order roughly tracks the stopband energy of the input signal.

The invention as described heretofore relates to an approximate processing method for reducing the power consumption of frequency-selective filters. The method utilizes adaptive processing principles for the run-time control of the number of stages utilized from an IIR or FIR filter structure that has a type of incremental refinement property. In particular, the filter structure must consist of a series of stages (such as individual second-order sections) ordered in such a way that the effective transfer function after the inclusion of each successive stage results in increased attenuation in the stopband region(s) while maintaining close to unity gain in the passband region(s). The adaptation mechanism used with such a structure is designed to minimize the number of stages that must be applied at any given time while ensuring that the filter output satisfies a specified criterion. Minimization of the number of stages utilized at any given time is desirable because of the resulting savings in power consumption by the underlying hardware. Accordingly, the invention has been described with respect to applying the process to an FIR structure.

In accordance with another aspect of the invention, the process of the invention will now be described as applied to an IIR filter structure. This process uses a slightly different adaptation criterion than the one described for the FIR implementation. Rather than seeking to keep the stopband power in the filter output below a specified level, the technique as applied to IIR filters is designed to keep the output SNR (ratio of the passband power to the stopband power in the filter output) below a specified level. It will be appreciated that both adaptation criteria are equally applicable to IIR as well as FIR cases. Furthermore, results are presented on the convergence of the order of the adapted filter to the correct filter order when the input signal satisfies the underlying theoretical assumptions of the process and the input SNR is known a-priori.

Figure 10:
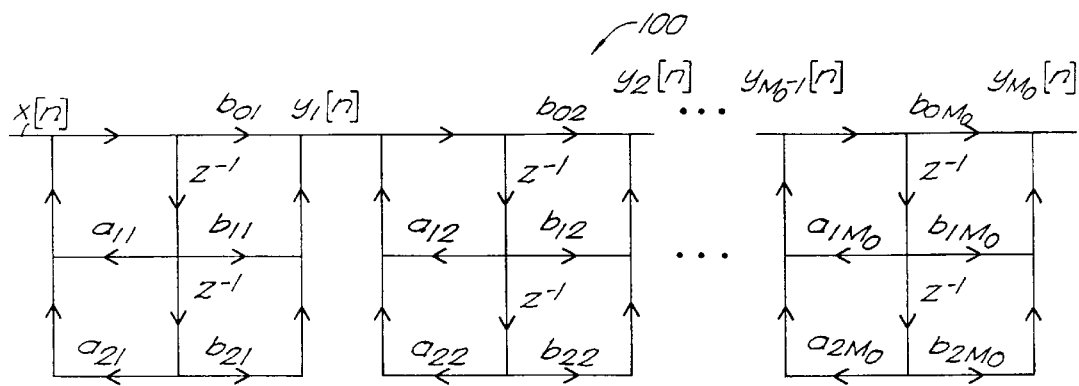
FIG. 10 is a schematic of an incremental refinement structure for an IIR digital filter.

Consider the case of a Butterworth filter of order 2 $M_0$. A cascade structure for this filter consists of a serial connection of $M_0$ second-order Direct-Form II sections, as shown in FIG. 10. FIG. 10 is a schematic of an incremental refinement structure 100 for an IIR digital filter. Each section corresponds to a pair of conjugate poles of the Butterworth filter and two zeros (both located at z=−1). Denoting the frequency response of the order-2 $M_0$ Butterworth filter by $H_{M_0}(\omega)$, it follows that:

$$H_{M_0} = G_1(\omega)G_2(\omega)G_3(\omega) \ldots G_{M_0}(\omega) \tag{12}$$

where $G_i(\omega)$ denotes the frequency response of the ith second-order section in the cascade structure of FIG. 10. It can be furthermore assured that $G_i(0)=1$. If only the first N sections ($N \leq M_0$) of the cascade structure in FIG. 10 are utilized, the resulting order-2N truncated Butterworth filter has the frequency response $H_N(\omega)$, given by:

$$H_N(\omega) = \prod_{k=1}^{N} G_k(\omega) \tag{13}$$

The Butterworth pole pairs are assigned to each of the second-order sections so that as the number of second-order sections is increased, the attenuation in the stopband of the filter also increases, while keeping the passband gain close to unity. An empirical strategy for making such a pole-pair assignment is as follows: the pole pair for the $M_0$th section is selected first as the one which results in $|H_{M_0-1}(\omega)|$ having the smallest maximum deviation (from unity) in the passband. From the remaining pole pairs, the pair for the $(M_0-1)$st section is selected as the one which results in $|H_{M_0-2}(\omega)|$ having the smallest maximum deviation (from unity) in the passband.

Figure 11:
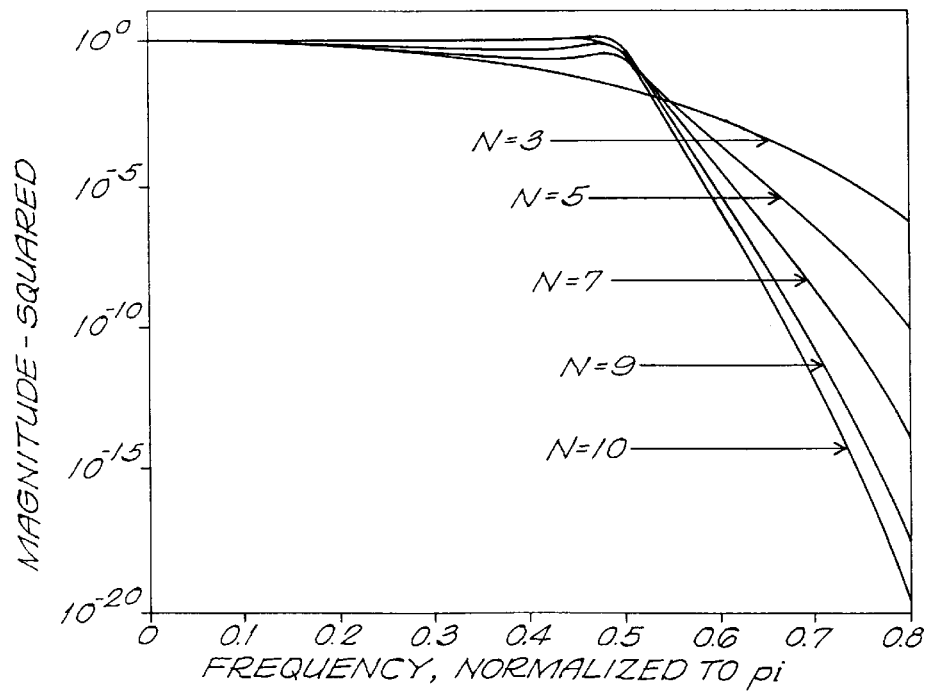
FIG. 11 is a graph having a plot of magnitude-squared frequency responses for truncations of a 20th-order Butterworth filter with 3, 5, 7, 9, and 10 second-order sections.

The process is continued backwards in an analogous manner until each section has been assigned its corresponding pole pair. To illustrate, consider the application of this strategy to a 20th order Butterworth filter with half-power frequency of $\pi/2$. The functions $|H_N(\omega)|^2$ obtained in this case are shown in the graph of FIG. 11. FIG. 11 shows a plot of magnitude-squared frequency responses for truncations of a 20th-order Butterworth filter with 3, 5, 7, 9, and 10 second-order sections. It should be observed that as the number of sections (N) is increased, the average attenuation in most of the stopband also increases. On the other hand, the filter gain remains close to unity in most of the passband.

Suppose that a stationary input x[n] with power spectrum $S_x(\omega)$ is filtered using the N-section truncated Butterworth filter of FIG. 10, where $1 \leq N \leq M_0$, to obtain an output y[n]. The signal-to-noise ratio, SNR, is defined as the ratio of the power in the passband to the power in the stopband. Specifically, the input SNR may be defined as $$ISNR \triangleq \frac{P_x^{PB}}{P_x^{SB}} \quad (14)$$

where $$P_x^{PB} = \frac{1}{2\pi} \int_{PB} S_x(\omega) d\omega \quad (15)$$

and $$P_x^{SB} = \frac{1}{2\pi} \int_{SB} S_x(\omega) d\omega. \quad (16)$$

Correspondingly, the output SNR is defined as $$OSNR[N] \triangleq \frac{P_y^{PB}[N]}{P_y^{SB}[N]} \quad (17)$$

where $$P_Y^{PB}[N] = \frac{1}{2\pi} \int_{PB} S_x(\omega) |H_N(\omega)|^2 d\omega \quad (18)$$

and $$P_y^{SB}[N] = \frac{1}{2\pi} \int_{SB} S_x(\omega) |H_N(\omega)|^2 d\omega. \quad (19)$$

Ideally, one would like to select N to be the smallest value for which $$OSNR[N] \geq OSNR_{tol} \quad (20)$$

where $OSNR_{tol}$ is the minimum tolerable output SNR for the application. Furthermore, if the input is non-stationary, OSNR[N] will be time varying and consequently the filter order would have to adapt over time to reduce power consumption. Of course, this requires an adaptation framework whose overhead is low relative to the expected savings in power consumption.

Figure 12:
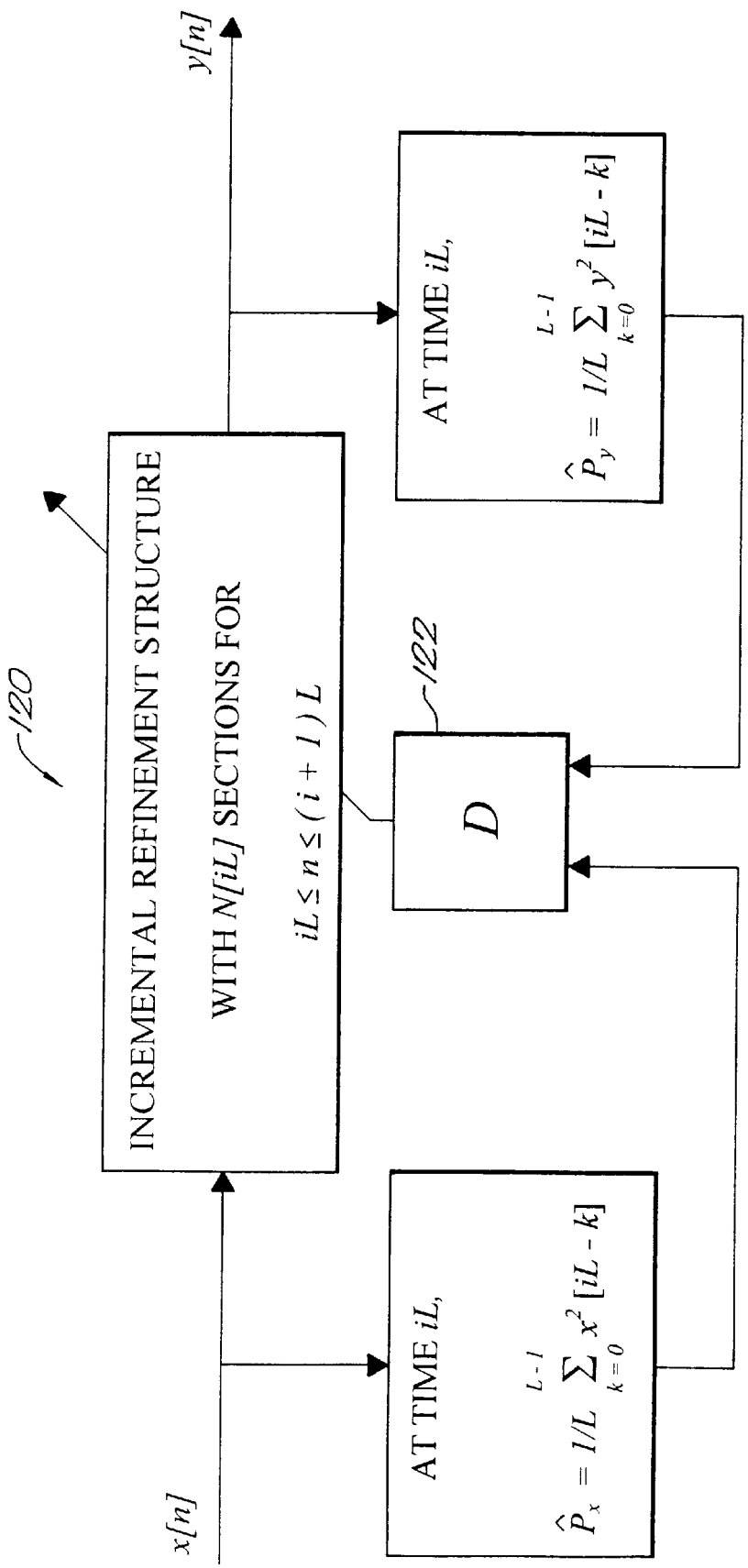
FIG. 12 is a schematic diagram of a filter and an adaptation process for updating the filter order after each new set of L output samples is computed in accordance with the invention.

FIG. 12 is a schematic diagram of a filter 120 and an adaptation process for updating filter order after each new set of L output samples is computed in accordance with the invention. The number of sections utilized in the filter's incremental refinement structure is updated for every new set of L output samples.

The update procedure involves the calculation of input and output signal-power estimates followed by the application of a decision module 122 shown in FIG. 12. The module 122 uses the signal-power estimates to form an estimate of the temporally local ISNR. This ISNR estimate is then used as the basis for selecting the filter order to be applied in computing the next set of L output samples. The precise formulation of the decision rule is based upon the following set of assumptions: (1) $S_x(\omega)$ in the passband is arbitrary, (2) $S_x(\omega)$ in the stopband is white but with unknown power, (3) $S_x(\omega)$ in the transition band is negligible, and (4) $|H_N(\omega)|^2$ in the passband is effectively equal to 1.

Consider a situation where a $N_0$-section ($N_0 \leq M_0$) truncated Butterworth filter is applied to a stationary input x[n] to obtain the output y[n]. ISNR and OSNR [$N_0$] are expressed in terms of the input signal power $P_x$ and the output signal power $P_y[N_0]$. Accordingly, $$P_x = \frac{1}{2\pi} \int_{-\pi}^{\pi} S_x(\omega) d\omega \quad (21)$$

and $$P_y[N_0] = \frac{1}{2\pi} \int_{-\pi}^{\pi} S_x(\omega) |H_{N_0}(\omega)|^2 d\omega \quad (22)$$

Next, assume that $S_x(\omega)$ is an unknown constant $\sigma^2_{SB}$ in the stopband, it is negligible in the transition band, and it is arbitrary in the passband. It then follows that $$P_y^{SB}[N_0] = \sigma^2_{SB} \frac{1}{2\pi} \int_{SB} |H_{N_0}(\omega)|^2 d\omega. \quad (23)$$

Furthermore, we note that $$P_x - P_y[N_0] = \sigma^2_{SB} \frac{1}{2\pi} \int_{SB} [1 - |H_{N_0}(\omega)|^2] d\omega + \quad (24)$$
$$\frac{1}{2\pi} \int_{PB} S_x(\omega)[1 - |H_{N_0}(\omega)|^2] d\omega.$$

Assuming that $|H_{N_0}(\omega)|^2$ is effectively equal to 1 in the passband, $$P_x - P_y[N_0] = \sigma^2_{SB} \frac{1}{2\pi} \int_{SB} [1 - |H_{N_0}(\omega)|^2] d\omega \quad (25)$$

which may be rearranged to yield $$\sigma^2_{SB} = (P_x - P_y[N_0]) \left( \frac{1}{2\pi} \int_{SB} [1 - |H_{N_0}(\omega)|^2] d\omega \right)^{-1}. \quad (26)$$

Substituting this expression for $\sigma^2_{SB}$ into equation (23) results as $$P_y^{SB}[N_0] = (P_x - P_y[N_0]) P_h^{SB}[N_0], \quad (27)$$

where $$P_h^{SB}[N_0] = \quad (28)$$
$$\left( \frac{1}{2\pi} \int_{SB} [1 - |H_{N_0}(\omega)|^2] d\omega \right)^{-1} \left( \frac{1}{2\pi} \int_{SB} |H_{N_0}(\omega)|^2 d\omega \right).$$

It follows that $$OSNR[N_0] = \frac{P_y[N_0] - (P_x - P_y[N_0])P_h^{SB}[N_0]}{(P_x - P_y[N_0])P_h^{SB}[N_0]} \quad (29)$$

Furthermore, under the stated assumptions, $$INSR = OSNR[N_0]P_h^{SB}[N_0]. \quad (30)$$

Therefore, we obtain $$ISNR = \frac{P_y[N_0] - (P_x - P_y[N_0])P_h^{SB}[N_0]}{(P_x - P_y[N_0])} \quad (31)$$

If now a filter with N sections ($N \leq M_0$) were to be used (instead of the $N_0$-section filter used previously) to process the same signal x[n], the following would be obtained $$OSNR[N] = \frac{INSR}{P_h^{SB}[N]} \quad (32)$$

To minimize power consumption, one would want to choose the smallest permissible value for N such that $$INSR\left(\frac{1}{P_h^{SB}[N]}\right) \geq OSNR_{tol} \quad (33)$$

or, equivalently, $$P_y[N_0] - (P_x - P_y[N_0])P_h^{SB}[N_0] \geq OSNR_{tol}(P_h^{SB}[N])(P_x - P_y[N_0]) \quad (34)$$

To obtain a practical (low cost) decision rule on the basis of the above theory, suppose that a filter of order $N_0$ is applied to obtain the output signal prior to and including time n. One may then obtain the following estimates:

$$\hat{P}_x = \frac{1}{L}\sum_{k=0}^{L-1} x^2[n-k] \quad (35)$$

$$\hat{P}_y[N_0] = \frac{1}{L}\sum_{k=0}^{L-1} y^2[n-k]. \quad (36)$$

Using these estimates in the inequality of equation (34) and recognizing that the values of the product $OSNR_{tol}$ ($P^{SB}_h[N]$) can be prestored, the decision rule may be designed to search for the smallest value of N satisfying the inequality. This search requires $O(M_0)$ operations, at most $M_0$ table look-up operations, two subtractions, at most $M_0+1$ multiplications and at most $M_0$ comparisons, where $M_0$ is the number of sections in the original Butterworth filter. The selected value of N becomes the number of sections used in the incremental refinement structure to produce the next L output samples.

The process continues in this way, updating the filter every L samples. Thus, for every new set of L output samples, the adaptation overhead involves $O(M_0)$ operations for the decision module 122, and on the order of 2 L multiplications and 2 L additions for calculating the estimates $\hat{P}_x$ and $\hat{P}_y$. Assuming that L is much greater than $M_0$, it is clear that the overhead is approximately two multiplications and two additions per output sample. For comparison, it should be noted that each second-order section of the filter requires five multiplications and four additions per output sample. Thus, even if the adaptive technique reduces the number of sections by only 1 over a particular time interval, there is a net reduction in power consumption over that interval.

It is of interest to determine the degree to which the filter order selected by the process adaptation framework converges to the theoretically minimum filter order for input signals that satisfy the assumptions underlying the derivation of the adaptation framework. Hereinafter it will be illustrated that better convergence is obtained as the duration L over which $P_x$ and $P_y[N_0]$ are estimated is made longer, and as $N_0$ is made larger. However, it is also noted that since filter order selections partition the range of possible ISNR values, the relation of the actual input SNR to the boundaries in this partitioning is an important factor in determining whether or not the truly optimal filter order is selected by the adaptation method.

For the convergence analysis, it is assumed that the input signal satisfies the same conditions as stipulated in the derivation of the adaptation framework as described previously. In particular, this means that the input signal x[n] is wide-sense stationary. When L consecutive samples of the output y[n] are produced using an $N_0$-section truncated Butterworth filter, it follows that these samples also belong to a stationary signal. The conclusion is that $\hat{P}_x$ and $\hat{P}_y[N_0]$ (as defined in equations (35) and (36)) represent estimates of the zero-lag autocorrelation values of x[n] and y[n], respectively. These well-known estimators converge to the true values of the zero-lag autocorrelations as L is made larger. Since these are the only signal-related quantities used in obtaining the ISNR estimate in accordance with equation (13), it is also expected that the ISNR estimate will converge to the true ISNR value as L is made larger.

To verify the influence of the estimation interval L on the ISNR estimate, the ISNR estimation method as described is applied to a synthetically generated random signal x[n]. This signal was designed to have a flat spectrum in the passband (0 to $3\pi/8$), a flat spectrum in the stopband ($5\pi/8$ to $\pi$), negligible energy in the transition band, and a fixed SNR throughout its 10,000 point duration. The signal was then filtered using an $N_0$-section truncated Butterworth filter. The L consecutive input and output samples (starting from the 1000th sample to avoid transient effects) were then used to obtain an estimate of ISNR. For a case where the true SNR of the synthetically generated signal x[n] was set to 0.07, in the graph of FIG. 13 the ISNR estimates obtained for different values of L and $N_0$ are shown. It is clear from the figure that as L gets larger the ISNR estimates converge to the active ISNR. Furthermore, it will be appreciated that for higher values of $N_0$, the convergence value is closer to the actual ISNR (0.07). It should be noted that lower values of $N_0$ correspond to frequency response shapes which violate the adaptation method's assumptions to a greater degree.

Figure 13:
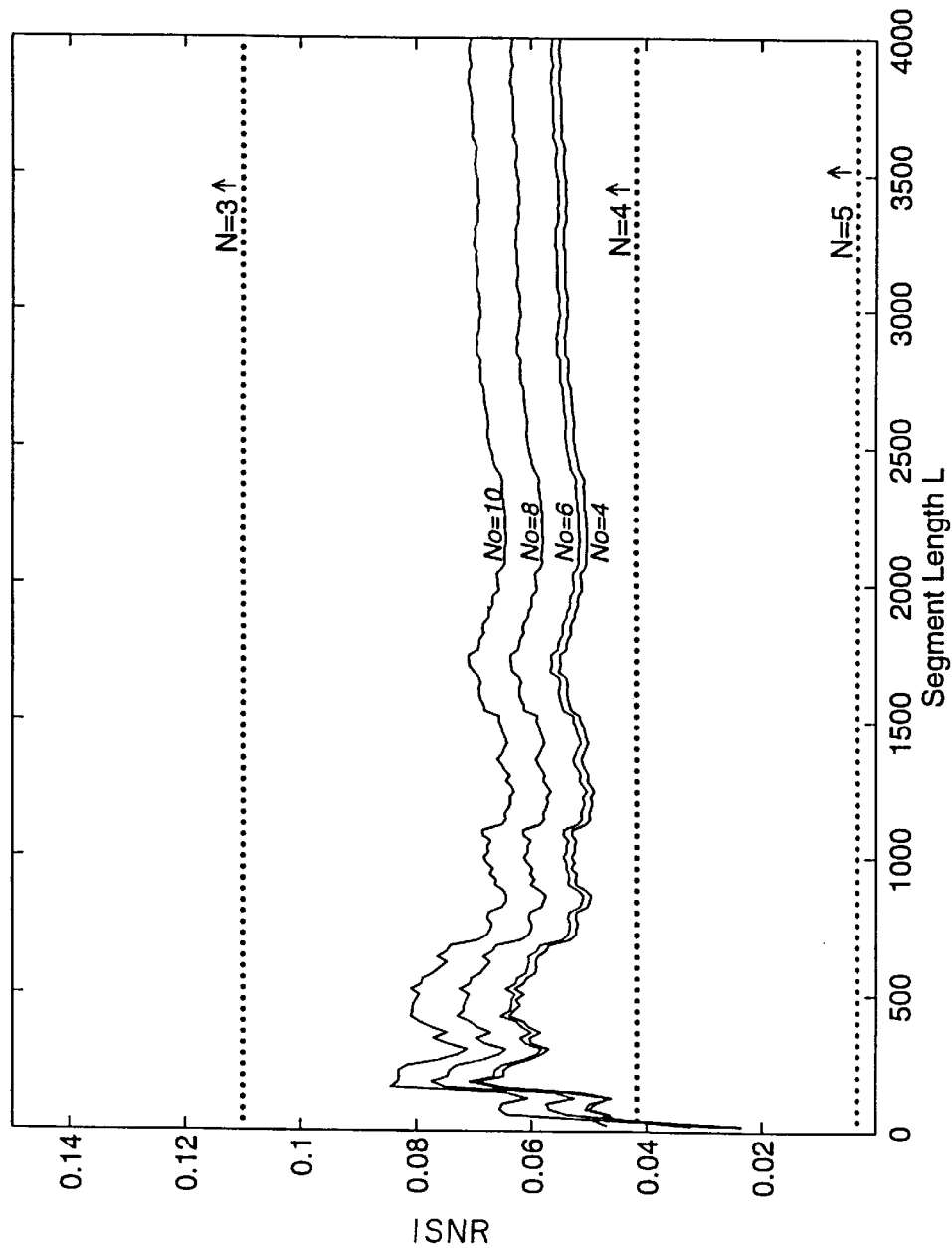
FIG. 13 is a graph having plots in which the solid curves represent ISNR estimates as a function of L and $N_0$.

FIG. 13 is a graph having plots in which the solid curves represent ISNR estimates as a function of L and $N_0$. The actual SNR for the input signal is 0.07. The straight dotted lines indicate the partitioning of ISNR space by optimal values for the number of filter sections to use in order to obtain an output SNR of at least 1000. Except for very small values of L, it is seen that the estimated ISNR leads to the same value for the optimal N as would have been the case if the true ISNR had been used. Obviously, this result is dependent on the fact that an ISNR of 0.07 happens to fall in the middle of the ISNR range corresponding to N=4. If, for example, the actual ISNR had been closer to 0.04, the estimated ISNRs would have crossed into the N=5 region for a larger set of values of L.

Figure 14:
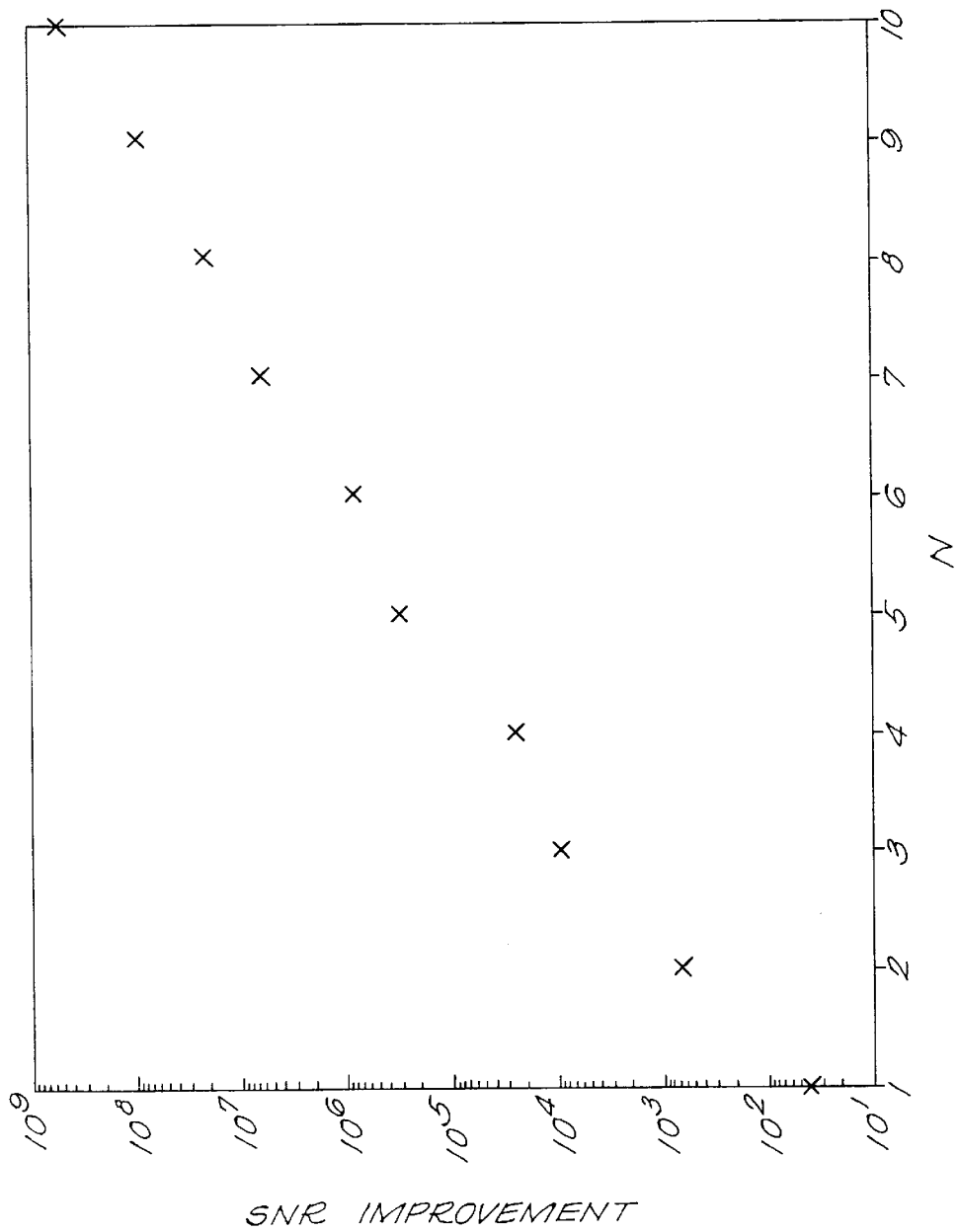
FIG. 14 is a graph showing a performance profile for truncations of a 20th-order Butterworth filter with half-power frequency $\pi/2$.

The potential of the approximate adaptive filtering process in accordance with the invention (utilizing a 10-section Butterworth filter) to reduce power consumption in the context of a speech processing example is now illustrated. Initially, it is noted from equation (32) that the quantity $1/P^{SB}_h[N]$ represents the factor by which the first set of N sections of the Butterworth incremental refinement structure improves upon the input SNR. FIG. 14 is a graph showing a performance profile for truncations of a 20th-order Butterworth filter with half-power frequency $\pi/2$. FIG. 14 shows $1/P^{SB}_h[N]$ as a function of N. The stopband in this case was defined to be between $5\pi/8$ and $\pi$. Clearly, the higher the filter order, the greater the resulting improvement in output SNR.

Figure 15A:
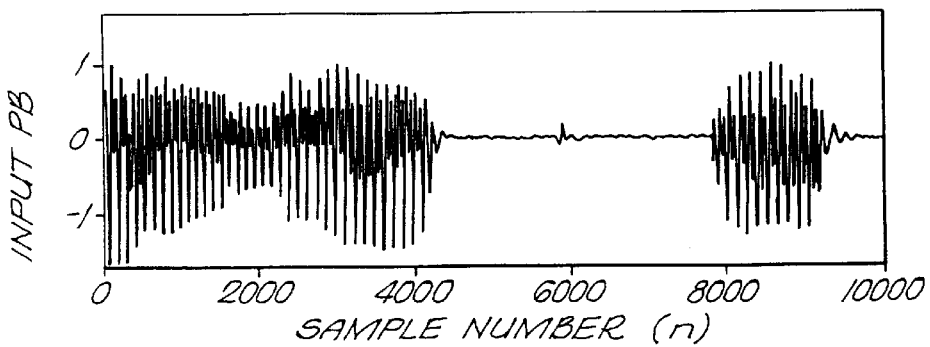
FIGS. 15A–15C show respective graphs of demultiplexing of FDM speech signals using low-power frequency selective filtering for the passband speech signal, stopband speech signal and the number of filter sections utilized as a function of sample number.
Figure 15B:
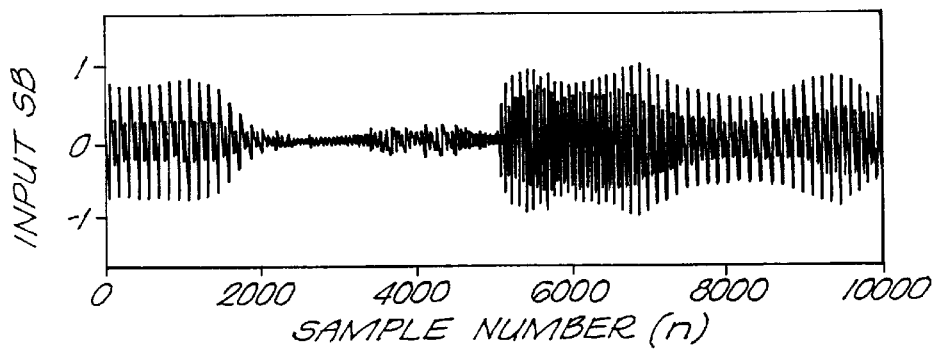
Figure 15C:
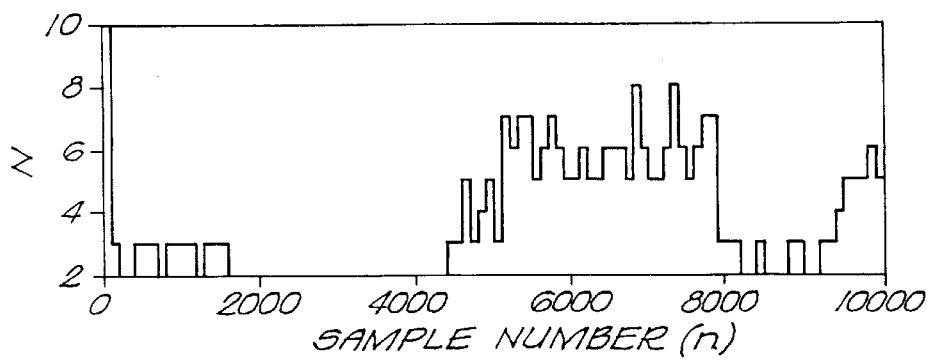

This incremental refinement structure along with the adaptation strategy described heretofore (with L=100 and $OSNR_{tot}=1000$) was applied to two speech signals which had been frequency-division multiplexed. One signal was in the passband region of the lowpass filter and the other was in the stopband region. The sampling rate for the FDM speech signal was 16000 Hz. FIGS. 15A–15C show the speech signal in the passband, the speech signal in the stopband, and the evolution of the number of filter sections used by the adaptive filtering method. Examination of these signals show that as expected, the number of filter sections used is large when the input SNR is small while the number of filter sections used is small when the input SNR is high.

An algorithm-based process has been presented for obtaining low-power implementations of important classes of IIR and FIR digital filters. In this process, adaptive filtering and approximate processing concepts are combined to design digital filters which have the important property that the filter order can be dynamically varied in accordance with the stopband energy of the input signal. Simulations of the proposed technique using a variety of speech signals have shown that the invention offers significant power savings over standard fixed-order implementations. Finally, it will be appreciated that while the proposed technique is illustrated in the context of lowpass filtering applications, it is equally applicable to other types of frequency-selective filtering.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A method of digital filtering comprising:
   (a) providing a filter response with a predetermined filter order;
   (b) receiving an input signal;
   (c) producing a predetermined set of filtered output samples defining an output signal from said input signal;
   (d) calculating the difference between the power associated with said input signal and the power associated with said output signal; and
   (e) varying the filter order of said filter response based on the calculated difference of power in order to change said filter response.

2. The method of claim 1 further comprising determining an optimum filter order.

3. The method of claim 2, wherein said determining step comprises ascertaining whether the signal-to-noise ratio of said output signal for a selected filter order is greater than or equal to a predetermined minimum tolerable signal-to-noise ratio for said output signal.

4. The method of claim 2, wherein said determining step comprises ascertaining whether the stopband energy of said output signal for a selected filter order is less than or equal to a predetermined maximum noise threshold.

5. The method of claim 2, wherein said step of varying the filter order comprises setting said filter order to said optimum filter order.

6. The method of claim 2, wherein said step of varying the filter order comprises incrementally varying said filter order towards said optimum filter order.

7. The method of claim 1, wherein said step of varying the filter order comprises defining a range of filter orders between a predetermined minimum filter order and a predetermined maximum filter order.

8. The method of claim 7, wherein said step of varying comprises selecting filter coefficients corresponding to lower order filters in said range which are subsets of filter coefficients of higher order filters in said range.

9. The method of claim 7, wherein said step of varying comprises arbitrarily selecting filter coefficients for each filter order in said range.

10. A digital filtering system comprising:
    means for providing a filter response with a predetermined filter order, said filter response producing a predetermined set of filtered output samples defining an output signal from a received input signal;
    means for calculating the difference between the power associated with said input signal and the power associated with said output signal; and
    means for varying the filter order of said filter response based on the calculated difference of power in order to change said filter response.

11. The system of claim 10 further comprising means for determining an optimum filter order.

12. The system of claim 10, wherein said varying means comprises means for defining a range of filter orders between a predetermined minimum filter order and a predetermined maximum filter order.

13. The system of claim 10, wherein said means for providing a filter response comprises a frequency-selective digital filter.

14. The system of claim 10, wherein said input signal comprises speech waveforms.

15. The system of claim 11, wherein said determining means comprises means for ascertaining whether the signal-to-noise ratio of said output signal for a selected filter order is greater than or equal to a predetermined minimum tolerable signal-to-noise ratio for said output signal.

16. The system of claim 11, wherein said determining means comprises means for ascertaining whether the stop band energy of said output signal for a selected filter order is less than or equal to a predetermined maximum noise threshold.

17. The system of claim 11, wherein said varying means comprises means for setting said filter order to said optimum filter order.

18. The system of claim 11, wherein said varying means comprises means for incrementally varying said filter order towards said optimum filter order.

19. The system of claim 12, wherein said varying means comprises means for selecting filter coefficients corresponding to lower order filters in said range which are subsets of filter coefficients of higher order filters in said range.

20. The system of claim 12, wherein said varying means comprises means for arbitrarily selecting filter coefficients for each filter order in said range.

21. The system of claim 13, wherein said digital filter comprises an FIR filter.

22. The system of claim 13, wherein said digital filter comprises an IIR filter.

\* \* \* \* \*